United States Patent [19]

Arakawa

[11] Patent Number: 5,051,958
[45] Date of Patent: Sep. 24, 1991

[54] NONVOLATILE STATIC MEMORY DEVICE UTILIZING SEPARATE POWER SUPPLIES

[75] Inventor: Hideki Arakawa, Yokohama, Japan

[73] Assignee: Fujitsu Limited, Kawasaki, Japan

[21] Appl. No.: 547,525

[22] Filed: Jul. 3, 1990

Related U.S. Application Data

[63] Continuation of Ser. No. 411,266, Sep. 25, 1989, abandoned, which is a continuation of Ser. No. 154,509, Feb. 5, 1988, abandoned, which is a continuation of Ser. No. 796,453, Nov. 12, 1985, abandoned.

[30] Foreign Application Priority Data

Nov. 13, 1984 [JP] Japan .................. 59-237435

[51] Int. Cl.⁵ .............................. G11C 14/00
[52] U.S. Cl. ..................... 365/228; 365/185;
    365/154; 365/95; 365/226
[58] Field of Search ............. 365/95, 104, 154, 156,
    365/184, 185, 226, 228, 229

[56] References Cited

U.S. PATENT DOCUMENTS 3,757,313  9/1973  Hines et al. .............. 365/154
4,400,799  8/1983  Gudger .................. 365/185

FOREIGN PATENT DOCUMENTS 0041585  4/1981  Japan .................. 365/154
56-44190  4/1981  Japan .
58-45697  3/1983  Japan .
58-118091  7/1983  Japan .

OTHER PUBLICATIONS

Becker et al., "A 5v Only 4K Nonvolatile Static Ram", IEEE ISSCC, Digest of Technical Papers, Feb. 1983, pp. 170–171.
IEEE Journal of Solid-State Circuits, vol. SC-18, No. 5, Oct. 1983, pp. 525–532, IEEE, New York, D. J. Lee et al., "Control Logic and Cell Design for a 4K NVRAM".

Primary Examiner—Glenn Gossage
Attorney, Agent, or Firm—Armstrong, Nikaido, Marmelstein, Kubovcik & Murray

[57] ABSTRACT

A semiconductor nonvolatile memory device includes a static type RAM constituted by a flip-flop circuit having a pair of loads, each load being supplied by separate power sources. An electrically erasable programmable ROM is constituted by a nonvolatile memory transistor operatively connected to the flip-flop circuit. A control circuit controls the supply timing of each of the separate power sources when data stored in the nonvolatile memory transistor is recalled to the flip-flop circuit. In the recall, the supply timing of each of the separate power sources is determined in such a way that the flip-flop circuit is set so as to invert from one state to the other corresponding to the ON/OFF state of the nonvolatile memory transistor.

6 Claims, 10 Drawing Sheets

NONVOLATILE STATIC MEMORY DEVICE UTILIZING SEPARATE POWER SUPPLIES

This application is a continuation of application Ser. No. 411,266 filed Sept. 25, 1989 which is a continuation of Ser. No. 154,509 filed Feb. 5, 1988 which is a continuation of Ser. No. 796,453 filed Nov. 12, 1985, all now abandoned.

BACKGROUND OF THE INVENTION

1. Field of the Invention

The present invention relates to a semiconductor nonvolatile memory device, more particularly to a nonvolatile random-access memory (NVRAM) constituted by a static type random-access memory (SRAM) and an electrically erasable programmable read-only memory (EEPROM).

2. Description of the Related Art

A memory cell unit of an NVRAM includes a cell of the SRAM and a cell of the EEPROM. The SRAM cell is, in general, constituted by a flip-flop circuit having two pairs of transistors and one power source. The EEPROM cell, i.e., the nonvolatile memory cell, is, in general, constituted by a single nonvolatile memory transistor (NV transistor) having a floating gate. The NVRAM cell basically functions as follows. Just before the power source is cut off, the data stored in the SRAM cell is temporarily stored in the EEPROM cell. When power is again supplied, the data stored in the EEPROM cell is recalled to the SRAM cell.

The store and recall operations are performed through the floating gate of the NV transistor. That is, in the store operation, plus or minus charges are injected to the floating gate of the NV transistor so that the NV transistor is set to the ON or OFF state corresponding to the state of the flip-flop circuit of the SRAM. The flip-flop circuit is constituted so there is an unbalance in the channel width and channel length of the load transistors and in the capacitors of the nodes for the purpose of enabling a recall when the NV transistor is turned OFF.

However, there are some problems in establishing such unbalanced states of the channel width and channel length of the transistors and of the capacitors of the nodes in the flip-flop circuit. That is, the memory cell area has to be increased to establish their unbalanced states. It is also difficult to establish precise unbalanced states between capacitors, because other factors of capacity besides expected values arise at the stage of design of the layout of the integrated circuit pattern.

SUMMARY OF THE INVENTION

The primary object of the present invention is to provide a semiconductor nonvolatile memory device enabling reduction of the memory cell area and high speed SRAM write/read operations.

Another object of the present invention is to provide an NVRAM not requiring an unbalanced state in an SRAM, thereby enabling reduction of the memory cell area and power consumption.

In accordance with the present invention, there is provided a semiconductor nonvolatile memory device including; an SRAM constituted by a flip-flop circuit having a pair of loads, each load being supplied by separate power sources; an EEPROM constituted by a nonvolatile memory transistor operatively connected to the flip-flop circuit; and a control circuit for controlling the supply timing of each of the separate power sources when data stored in the nonvolatile memory transistor is recalled to the flip-flop circuit. In the recall, the supply timing of each of the separate power sources is determined in such a way that the flip-flop circuit is set so as to invert from one state to the other corresponding to the ON/OFF state of the nonvolatile memory transistor.

DESCRIPTION OF THE PREFERRED EMBODIMENTS

Before describing the preferred embodiments, an explanation will be given of a conventional NVRAM for reference.

Figure 1:
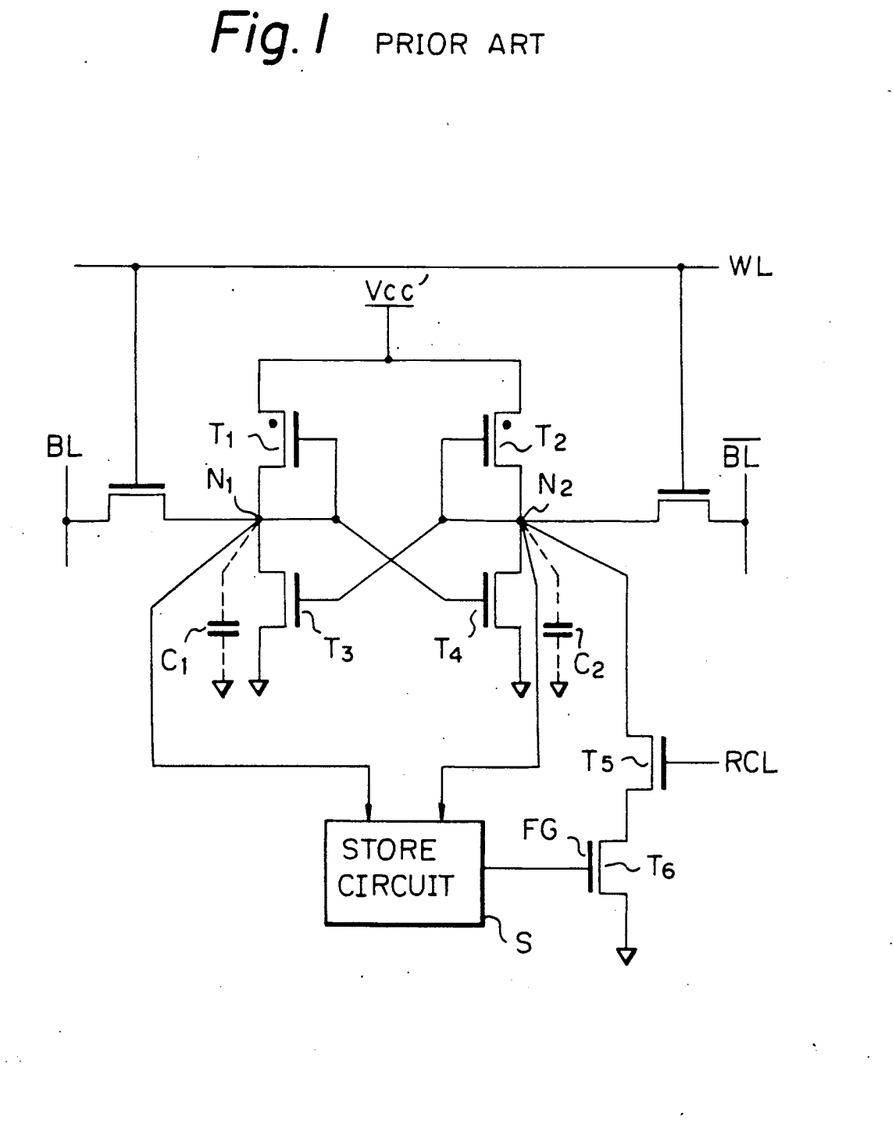
FIG. 1 is a schematic circuit of a conventional NVRAM.

Referring to FIG. 1, an SRAM cell is constituted by a flip-flop circuit which includes two depletion type metal-oxide semiconductor (MOS) transistors $T_1$ and $T_2$ as loads and two enhancement type MOS transistors $T_3$ and $T_4$. The EEPROM cell, i.e., the nonvolatile memory cell is constituted by a single MOS transistor $T_6$ having a floating gate FG. The MOS transistor $T_5$ is used in a recall, and a recall signal is supplied to a gate of it. The block S is a circuit for storing and is used for injecting plus or minus charges to the floating gate FG in response to the "H" or "L" level of nodes $N_1$ and $N_2$ in a store operation. Accordingly, writing of data to the NV transistor $T_6$ is performed by injecting the charge from the circuit S to the floating gate FG. As a result the threshold level of the transistor $T_6$ is changed, and the transistor $T_6$ is turned ON or OFF corresponding to the state of the flip-flop circuit of the SRAM.

Figure 2:
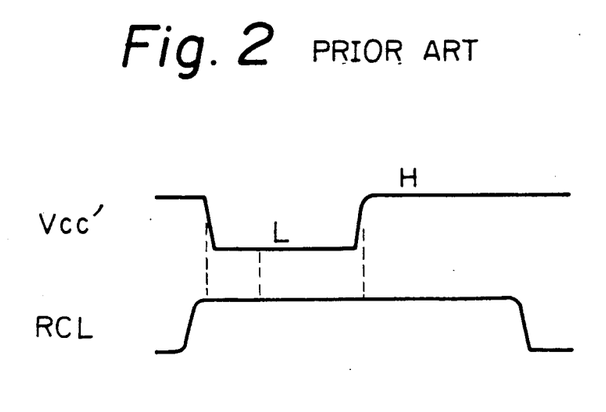
FIG. 2 is a timing chart of a power source voltage and a recall signal shown in FIG. 1.

The recall operation is performed as follows: The single source voltage $V_{CC}'$ is pulled up after a recall signal is applied to the gate of the recall transistor $T_5$, as shown in FIG. 2. The transistor $T_5$ is already turned ON when the SRAM is activated. At this time, if the transistor $T_6$ is turned ON, the node $N_2$ of the SRAM becomes "L" level and the node $N_1$ becomes "H" level, so that the transistor $T_3$ is turned OFF and the transistor $T_4$ is turned ON.

When the transistor $T_6$ is turned OFF, the node $N_2$ becomes "H" level and the node $N_1$ becomes "L" level, so that the transistor $T_3$ is turned ON and the transistor $T_4$ is turned OFF.

For the purpose of enabling the flip/flop operation as mentioned above, the flip-flop circuit is constituted so as to be unbalanced. That is, the flip-flop circuit has been made unbalanced by the channel width and channel length of the load transistors $T_1$ and $T_2$ and by the capacitors of the nodes. For example, the unbalanced state of each load transistor is determined by the ratio between the channel width (W) and channel length (L), i.e., W/L, while, the unbalance state of each capacitor is determined by the capacity of the capacitor $C_1$ of the node $N_1$ and the capacity of the capacitor $C_2$ of the node $N_2$. The capacities of $C_1$ and $C_2$ are formed by the pattern area and shape of the integrated circuit.

When the capacity of $C_1$ is set much larger than that of $C_2$ and when the transistor $T_6$ is turned OFF, a recall operation is performed as follows. Since the capacity of $C_1$ is much larger than the capacity of $C_2$, the charging time of the capacitor $C_1$ is longer than that of the capacitor $C_2$. Accordingly, the level of the node $N_1$ becomes the "L" level and that of the node $N_2$ becomes the "H" level in an initial state. Consequently, flip/flop operation can be performed by setting the unbalance state of the channel width and channel length and of the capacity of the capacitor of the nodes.

Figure 3:
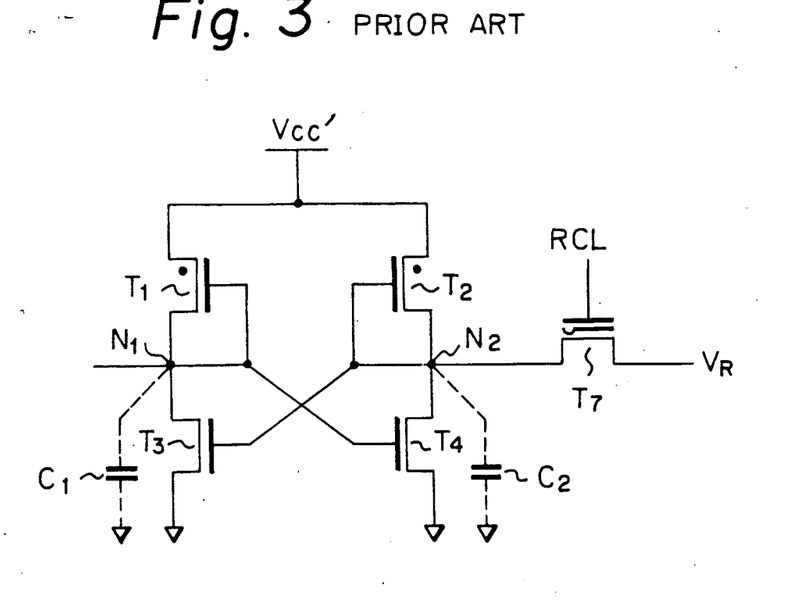
FIG. 3 is a schematic circuit of another conventional NVRAM.
Figure 4:
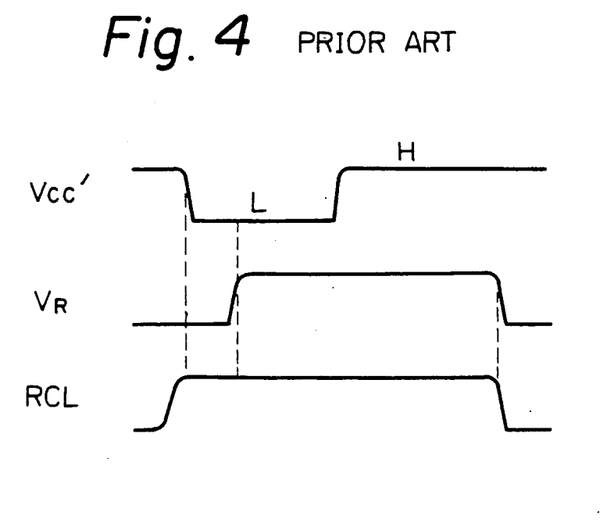
FIG. 4 is a timing chart of a power source, an external signal, and a recall signal shown in FIG. 3.

Referring to FIG. 3, the NV transistor $T_7$ is constituted by a floating gate tunnel oxide (FLOTOX) type transistor. The circuit S shown in FIG. 1 is eliminated since the charge is injected from the external voltage $V_R$. A timing chart of these voltages $V_{CC}'$ and $V_R$ and the recall signal is shown in FIG. 4. The operation of this NVRAM is the same as that of the NVRAM shown in FIG. 1, except that the capacity of capacitor $C_2$ is set larger than that of the capacitor $C_1$.

However, there are some problems in the above-explained conventional NVRAM.

First, the capacity of the capacitor $C_1$ is influenced by the transistors $T_1$ and $T_2$, and the capacity of $C_2$ is influenced by the transistors $T_2$, $T_4$, $T_5$, and $T_6$. Therefore, the capacity of $C_2$ tends naturally to be larger than that of $C_1$. Accordingly, the capacity of $C_1$ must be designed to be considerably large in value in order to satisfy the conditions $C_1 > C_2$. As a result, it is necessary to increase the memory cell area in the layout design of the IC circuit pattern.

Second, for example, when the ratio W/L of the transistor $T_1$ is set larger than that of the transistor $T_2$, the memory cell also takes increased space in the IC circuit pattern.

Third, since the flip-flop circuit is set to an unbalanced state, it is difficult to achieve a high speed access operation.

Finally, it is necessary to pass a considerable cell current in order to establish an unbalance state. The power consumption is considerably increased by this large cell current. Therefore, it is difficult to replace the load transistor with high resistance polycrystalline silicon element.

An NVRAM according to an embodiment of the present invention will be explained in detail hereinafter.

Figure 5:
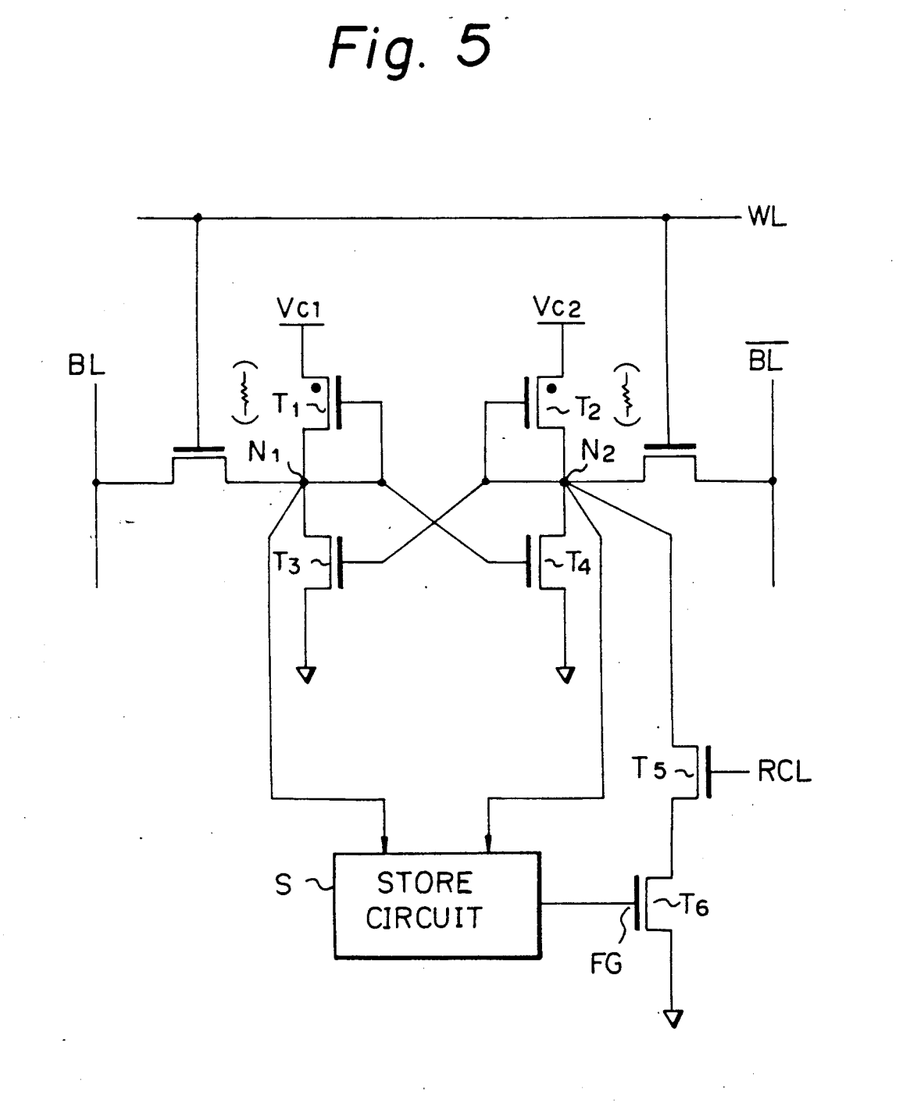
FIG. 5 is a schematic circuit of an NVRAM according to an embodiment of the present invention.

As shown in FIG. 5, the primary difference between the present invention and the conventional circuit lies in the number of power sources supplying the SRAM. That is, a single power source $V_{CC}'$ is used for supplying the source voltage to the flip-flop circuit in FIGS. 1 and 3. Separate power sources $V_{C1}$ and $V_{C2}$ are provided to the flip-flop circuit in the present invention.

Another difference between the present invention and the conventional circuit derives from the separate power sources mentioned above. That is, an unbalance state of the flip-flop circuit is not necessary in the present invention. Thus, additionally, it is possible to use high resistance polycrystalline silicon as loads instead of the load transistors.

Consequently, the memory cell area can be considerably reduced compared with a conventional memory cell. Moreover, the power consumption can be reduced and a high speed access operation can be achieved in the present invention.

Referring to FIG. 5, wherein the same reference letters are attached to elements the same as shown in FIGS. 1 and 3, a first power source voltage $V_{C1}$ is supplied to the drain of the load transistor $T_1$, while a second power source voltage $V_{C2}$ is supplied to the drain of the load transistor $T_2$. These power source voltages $V_{C1}$ and $V_{C2}$ are supplied to each drain based on different supply timings, as shown in FIGS. 6 to 8.

The operation of this circuit will be explained with respect to a recall operation. The same explanation applies to the store operation as with the conventional circuit shown in FIGS. 1 and 3.

Figure 6:
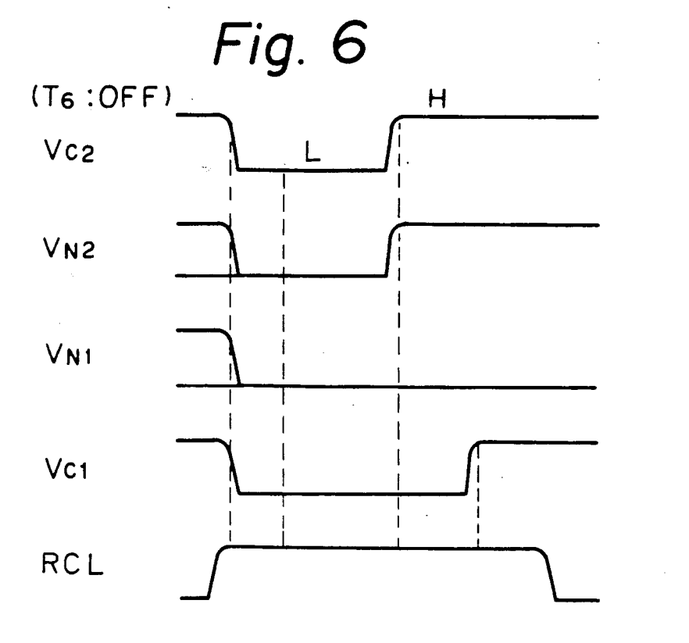
FIGS. 6 to 8 are timing charts of each voltage and a recall signal shown in FIG. 5.
Figure 7:
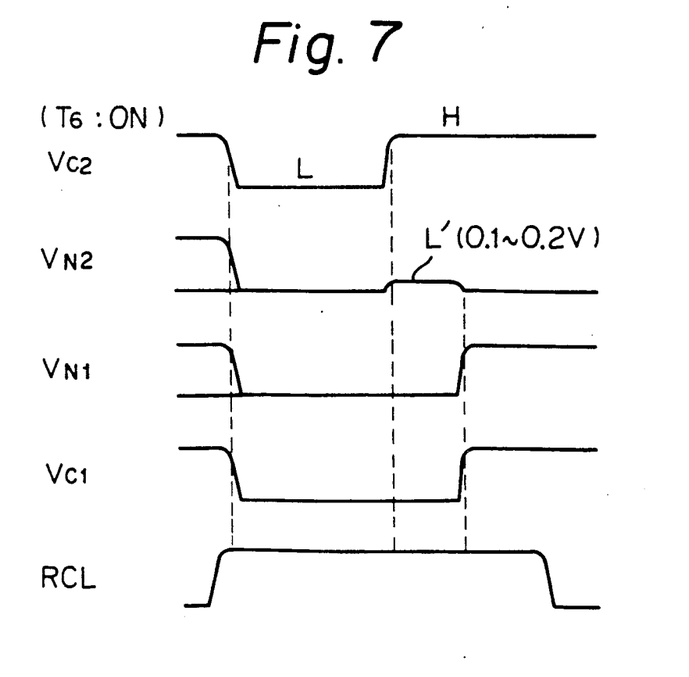
Figure 8:
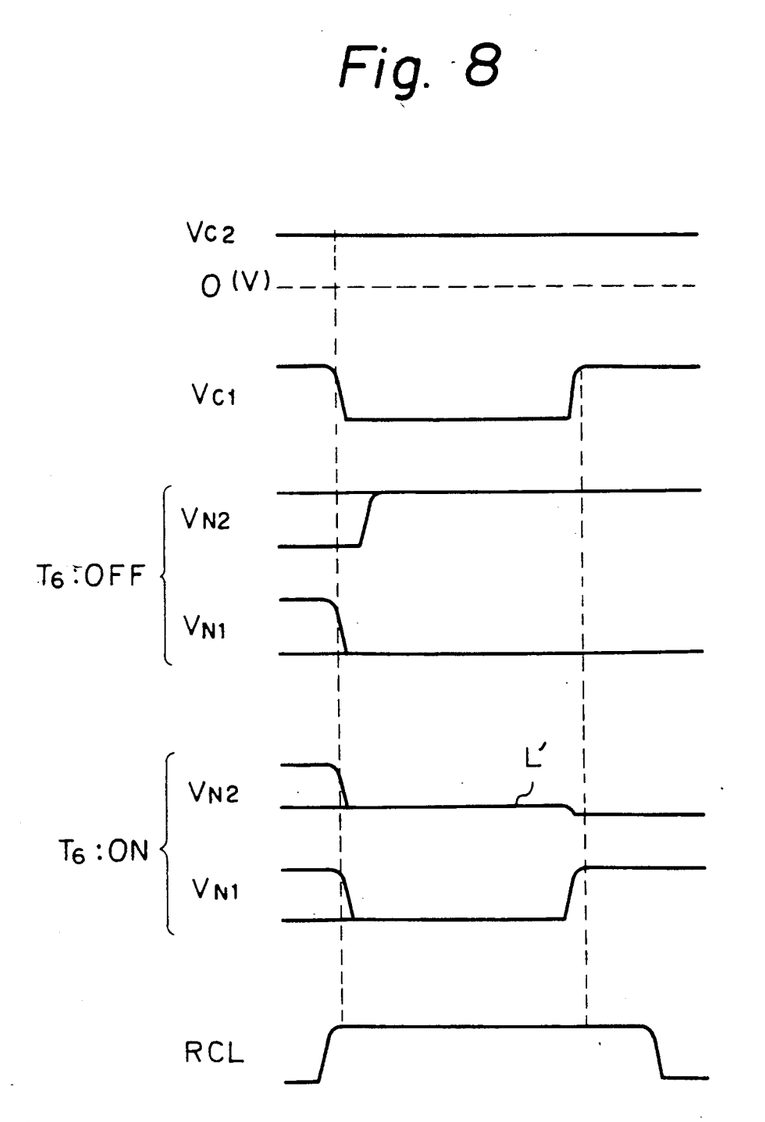

In the recall operation, the recall transistor $T_5$ is turned ON by the high level recall signal RCL as shown in FIGS. 6 to 8. FIG. 6 is a timing chart when the NV transistor $T_6$ is turned OFF, and FIG. 7 one when the NV transistor $T_6$ is tuned ON. In both cases, the second power source $V_{C2}$ is pulled up to the "H" level in an earlier supply timing than the first power source voltage $V_{C1}$.

When the transistor $T_6$ is turned OFF, the voltage level $V_{N2}$ of the node $N_2$ is pulled up from the "L" level to "H" level at the same time as the voltage $V_{C2}$ is pulled up. When the node $N_2$ becomes the "H" level, the transistor $T_3$ is turned ON and the voltage level $V_{N1}$ of the node $N_1$ is maintained to the "L" level. This "L" level state of the node $N_1$ is also held after the first power source voltage $V_{C1}$ is pulled up. As a result, the flip-flop circuit of the SRAM is set to this state.

Moreover, the channel width and the channel length of the transistors $T_2$, $T_5$, and $T_6$ are set to the following conditions for the purpose of a certain recall operation when the transistor $T_6$ is turned ON. That is, the following formula is given as the ratio of each channel width and channel length:

$$\left( \frac{W_5}{L_5} + \frac{W_6}{L_6} \right) / \frac{W_2}{L_2} \gtrsim -5$$

where $W_2$ and $L_2$ are the channel width and channel length of the transistor $T_2$, $W_5$ and $L_5$ are those of the transistor $T_5$, and $W_6$ and $L_6$ are those of the transistor $T_6$.

According to the above conditions, as shown in FIG. 7, when the second power source voltage $V_{C2}$ is pulled up, the level $V_{N2}$ of the node $N_2$ is maintained at the "L" level so that the transistor $T_3$ is turned OFF. In this case, although the level $V_{N2}$ is slightly pulled up from the zero level as shown by the "L'" level (0.1 to 0.2 volt) when the voltage $V_{C2}$ is pulled up, the transistor $T_3$ is not turned ON because this "L'" level is very small compared with the threshold level $V_{TH}$ necessary for turning ON the transistor $T_3$. When the first power source voltage $V_{C1}$ is pulled up, the voltage level $V_{N1}$ of the node $N_1$ is pulled up from the "L" level to "H" level, since the transistor $T_3$ is turned OFF. Accordingly, the transistor $T_4$ is turned ON since the node $N_1$ is high. The voltage level $V_{N2}$ of the node $N_2$ is maintained to the "L" level.

FIG. 8 is a timing chart of another embodiment. In this case, the second power source voltage $V_{C2}$ is supplied to the SRAM from the initial state with a constant voltage, and this voltage is not changed to the "L" level. Accordingly, the voltage level $V_{N2}$ of the node $N_2$ is pulled up to the "H" level when the transistor $T_6$ is turned OFF. The merits of this circuit lie in elimination of a switching circuit for the power source voltage and reduction of the recall time because no switching time of the voltage $V_{C2}$ is necessary.

Figure 10:
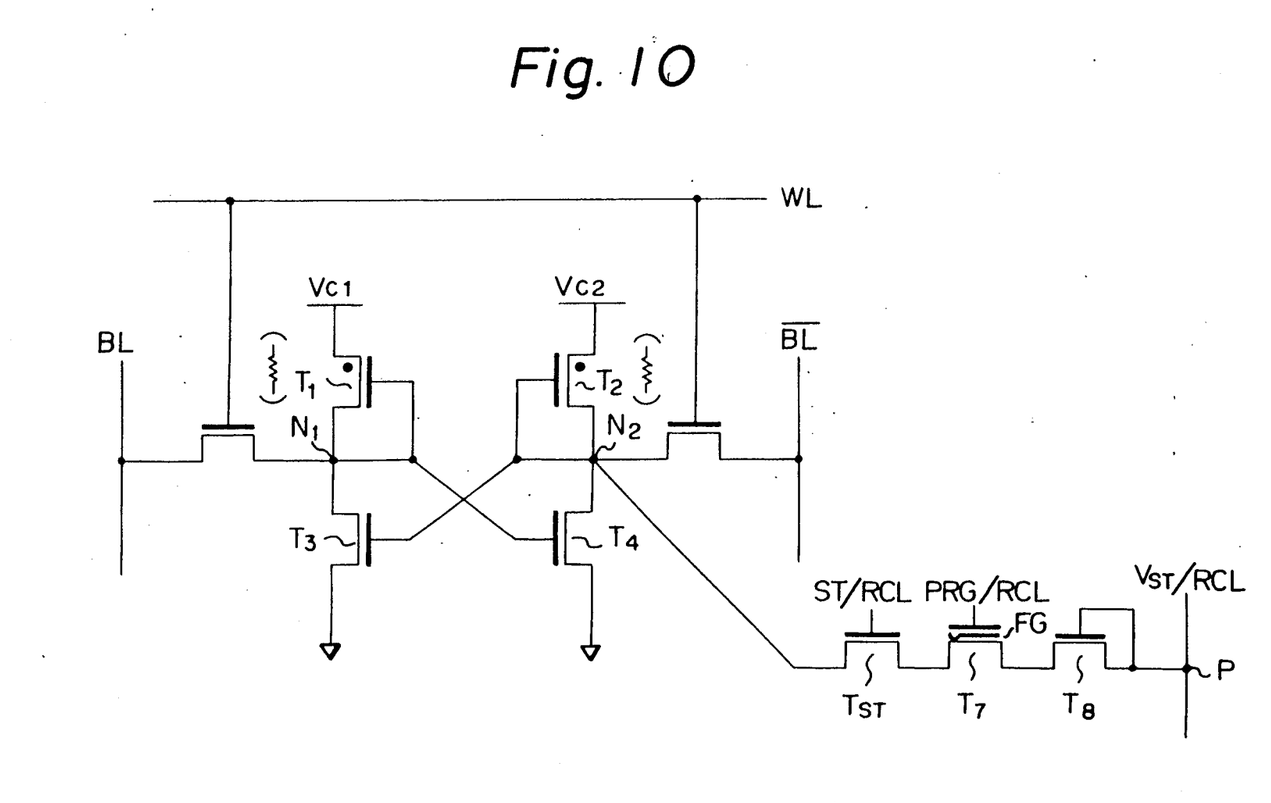
FIG. 10 is a schematic circuit of an NVRAM according to another embodiment of the present invention.

Moreover, as shown in FIGS. 5 and 10, it is possible to replace both the load transistors $T_1$ and $T_2$ with high resistance polycrystalline silicon elements. Such polycrystalline silicon elements are sufficient when the load current is not that high, e.g., is of the nano ampere order. In the present invention, since no unbalance state of the flip-flop circuit is necessary, it is possible to use polycrystalline silicon elements, so the power consumption can be considerably reduced compared with a conventional circuit.

Figure 9:
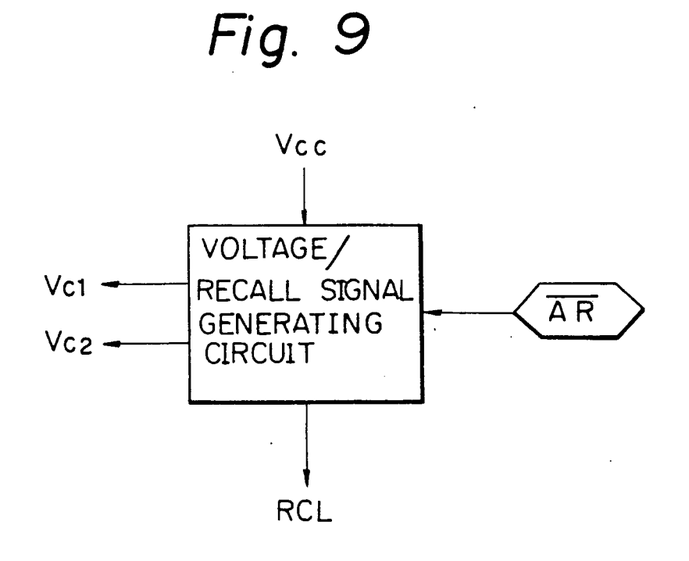
FIG. 9 is a schematic block view of a voltage/recall signal generating circuit shown in FIG. 5.

FIG. 9 shows a voltage/recall signal generating circuit for controlling the supply timing of the first voltage $V_{C1}$ and the second voltage $V_{C2}$ and for generating the recall signal RCL based on an external power source $V_{CC}$ and an array recall signal $\overline{AR}$. An explanation of this block will be given in detail in FIG. 12.

FIG. 10 shows another embodiment of the NVRAM according to the present invention. As is obvious from the drawing, the first power source voltage $V_{C1}$ is supplied to the drain of the load transistor $T_1$, and the second power source voltage $V_{C2}$ is supplied to that of the transistor $T_2$, as in the first embodiment shown in FIG. 5 the above-mentioned formula shown with respect to FIG. 5 also applies to this circuit. The transistor $T_{ST}$ is used for transferring the data from the SRAM to the NV transistor $T_7$ in a store operation instead of the circuit S shown in FIG. 5. The NV transistor $T_7$ is constituted by a FLOTOX type transistor as explained in FIG. 3. The transistor $T_8$ is used as a diode.

Figure 11:
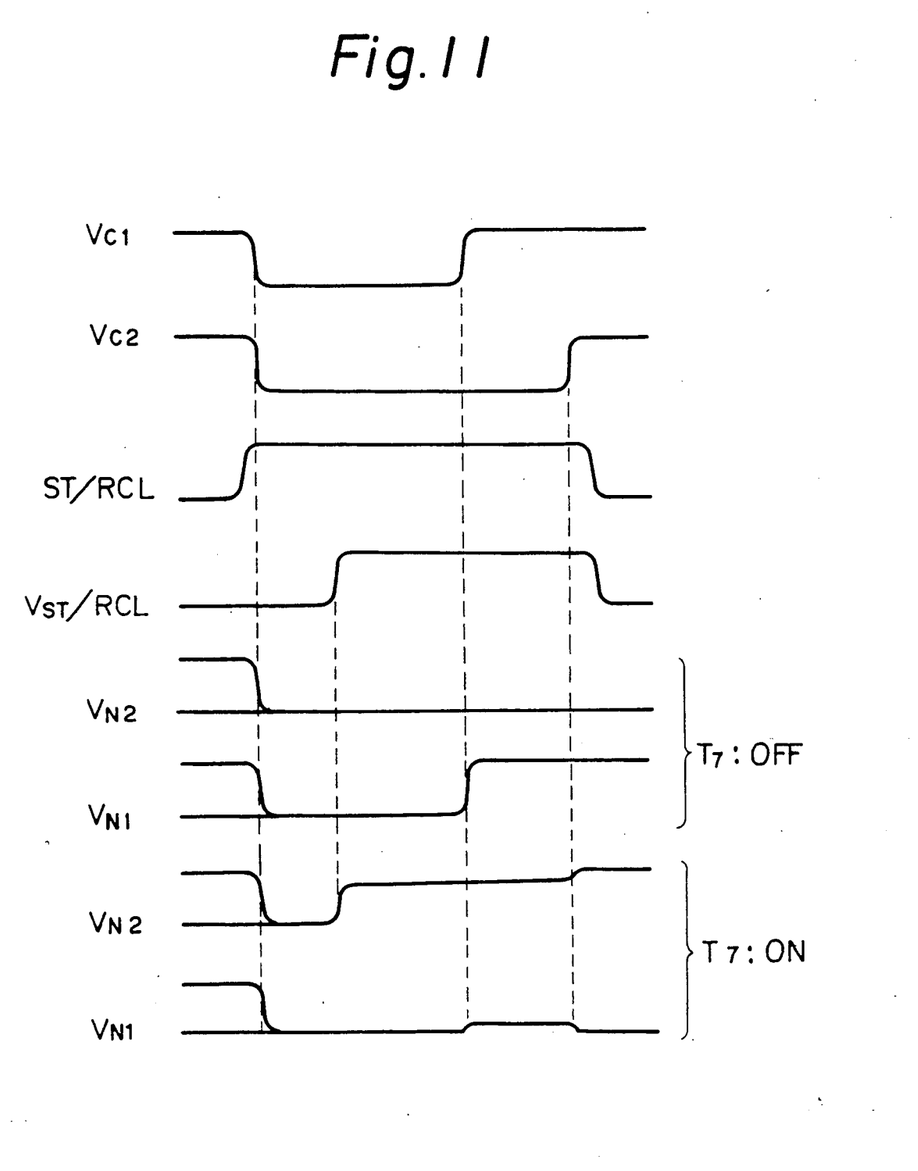
FIG. 11 is a timing chart of each voltage and each recall signal shown in FIG. 10.

In this case, the first power source voltage $V_{C1}$ is supplied to the transistor $T_1$ at an earlier supply timing than the second voltage $V_{C2}$ as shown in FIG. 11. In a recall operation, the recall current is supplied from the point P. That is, the external voltage $V_{ST}/RCL$ supplied to the point P. The transistor $T_8$ functions as a diode so that the external voltage appears at the source of the transistor $T_7$. Accordingly, the floating gate FG is injected with a plus charge. In the recall operation, the transistor $T_{ST}$ is turned ON by the recall signal RCL.

When the NV transistor $T_7$ is turned OFF, as shown in FIG. 11, and the first power source voltage $V_{C1}$ is pulled up, the voltage level $V_{N1}$ of the node $N_1$ is pulled up at the same time. When the second power source voltage $V_{C2}$ is pulled up, the voltage level $V_{N2}$ of the node $N_2$ is maintained at the "L" level since the transistor $T_4$ is turned ON.

When the NV transistor $T_7$ is turned ON and the voltage $V_{C1}$ is pulled up, the voltage level $V_{N2}$ is gradually pulled up under the influence of the external voltage $V_{ST}/RCL$. When the voltage $V_{C2}$ is pulled up, the voltage level $V_{N2}$ is completely pulled up. The voltage level $V_{N1}$ of the node $N_1$ is maintained at the "L" level. Consequently, a flip/flop operation is performed.

Figure 12:
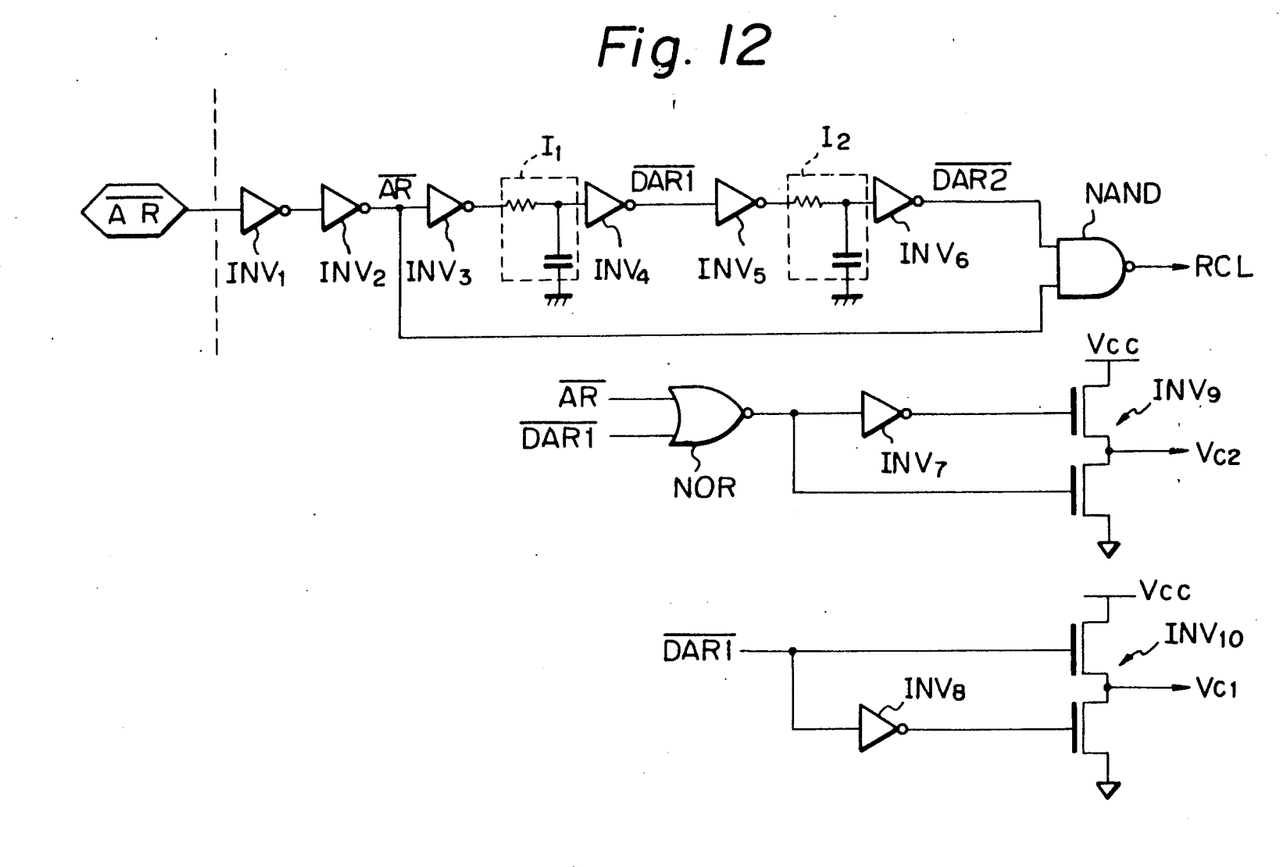
FIG. 12 is a detailed circuit of the voltage/recall signal generating circuit shown in FIG. 9.

FIG. 12 shows in detail the circuit of the voltage/recall signal generating circuit shown in FIG. 9. This circuit is constituted by inverters $INV_1$ to $INV_{10}$, a NOR gate, a NAND gate, and two integrated circuits $I_1$ and $I_2$. The circuit is used for controlling the supply timing of separate power sources and for applying different supply timings between the first power source voltage $V_{C1}$ and the second power source voltage $V_{C2}$. Moreover, it is used for supplying a recall signal RCL. When the array recall signal $\overline{AR}$ is supplied to the inverter $INV_1$, the recall signal RCL is obtained through the NAND gate after inversion and delay. The first delay signal $\overline{DAR1}$ is obtained from the inverter $INV_4$, and the second delay signal $\overline{DAR2}$ is obtained from the inverter $INV_6$.

Figure 13:
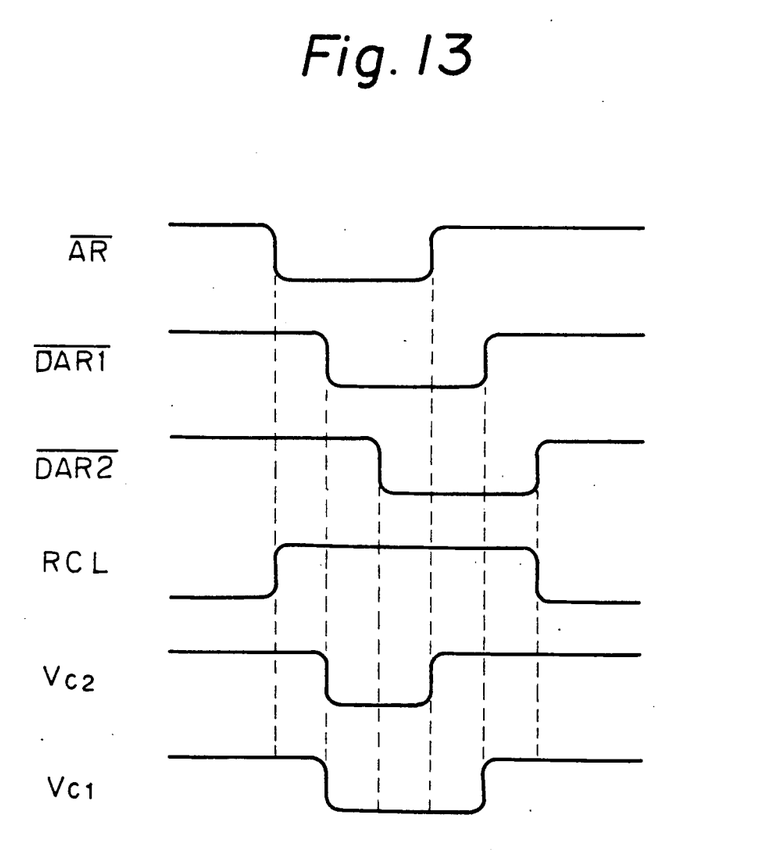
FIG. 13 is a timing chart of each voltage and the recall signal shown in FIG. 12.

FIG. 13 is a timing chart of these signals. When $\overline{AR}$ and $\overline{DAR1}$ are the "L" level, the voltage level $V_{C2}$ is the "L" level. When $\overline{AR}$ is changed to the "H" level, the voltage level $V_{C2}$ becomes the "H" level. When $\overline{AR}$ is changed to the "H" level, the first delay signal $\overline{DAR1}$ is changed to the "H" level after a short delay. When $\overline{DAR1}$ becomes the "H" level, the voltage level $V_{C1}$ also becomes the "H" level. As shown in FIGS. 12 and 13, two separate power source voltages $V_{C1}$ and $V_{C2}$ having different supply timings can be obtained from this circuit.

What is claimed is:

1. A semiconductor nonvolatile memory device comprising:

a first power source line;

a second power source line;

a static type random-access memory cell constituted by a flip-flop circuit having first and second input-/output nodes, a first load connected between the first power source line and the first input/output node, and a second load connected between the second power source line and the second input-/output node;

an electrically erasable programmable read-only memory cell constituted by a nonvolatile memory transistor and a recall transistor connected in series between the second input/output node and a ground potential, said ground potential being applied to the second input/output node during a recall period when the nonvolatile memory transistor and recall transistor are turned ON; and a voltage/recall signal generating circuit, connected to the first and second power source lines and the recall transistor, said voltage/recall signal generating circuit receiving an array recall signal and an external power source voltage, the voltage/recall signal generating circuit generating a recall signal in response to the array recall signal, said array recall signal defining the recall period to turn the recall transistor ON, and said voltage/recall signal generating circuit controlling a supply timing of the first and second power source lines during the recall period by pulling a voltage of the first power source line up to a predetermined voltage after the voltage of the second power source line is pulled up to the predetermined voltage, therein setting the flip flop circuit selectively to one of two states corresponding to a value stored in the nonvolatile memory cell, wherein said voltage/recall signal generating circuit includes a first delay circuit which generates a first delayed array recall signal delaying the array recall signal, a second delay circuit which generates a second delayed array recall signal delaying the first delayed array recall signal, a gate circuit, which generates the recall signal having a predetermined pulse width, said gate circuit receiving the array recall signal and the second delayed array recall signal, a first voltage supply circuit, which receives said first delayed recall signal, for supplying the external power source voltage to the first power source line, and a second voltage supply circuit, which supplies the external power source voltage to the second power source line before the first voltage supply circuit supplies the external power source voltage to the first power source line, said second voltage supply circuit receiving the first delayed array recall signal and the array recall signal.

2. A semiconductor nonvolatile memory device as claimed in claim 1, wherein the ratio of each channel width and each channel length of transistors in said flip-flop circuit and said nonvolatile memory transistor is previously set by the following conditions for a certain recall operation when the nonvolatile memory transistor is turned ON, that is, $$\left( \frac{W_5}{L_5} + \frac{W_6}{L_6} \right) / \frac{W_2}{L_2} \geq 5$$

where $W_2$ and $L_2$ are the channel width and channel length of a transistor constituting the second load, $W_5$ and $L_5$ are the channel width and channel length of the recall transistor, and $W_6$ and $L_6$ are the channel width and channel length of the nonvolatile memory transistor.

3. A semiconductor nonvolatile memory device as claimed in claim 1, wherein each of said first and second loads comprises a depletion type MOS transistor.

4. A semiconductor nonvolatile memory device as claimed in claim 1, wherein each of said first and second loads comprises a high resistance polycrystalline silicon element.

5. A semiconductor nonvolatile memory device comprising:
  a first power source line;
  a second power source line;
  a static type random-access memory cell constituted by a flip-flop circuit having first and second input/output nodes, a first load connected between the first power source line and the first input/output node, and a second load connected between the second power source line and the second input/output node;
  an electrically erasable programmable read-only memory cell constituted by a nonvolatile memory transistor and a recall transistor connected in series between the second input/output node and a ground potential, said ground potential being applied to the second input/output node during a recall period when the nonvolatile memory transistor and recall transistor are turned ON; and
  a voltage/recall signal generating circuit, connected to the first and second power source lines and the recall transistor, said voltage/recall signal generating circuit receiving an array recall signal and an external power source voltage, the voltage/recall signal generating circuit generating a recall signal in response to the array recall signal, said array recall signal defining the recall period to turn the recall transistor ON, and said voltage/recall signal generating circuit controlling a supply timing of the first and second power source lines during the recall period by pulling a voltage of the first power source line up to a predetermined voltage after the voltage of the second power source line is pulled up to the predetermined voltage, therein setting the flip-flop circuit selectively to one or two states corresponding to a value stored in the nonvolatile memory cell,
  wherein said voltage/recall signal generating circuit includes
  a first circuit for generating the recall signal having a pulse width wider than an active period of the array recall signal, said first circuit receiving the array recall signal,
  a second circuit for lowering the voltage of the second power source line after the recall signal is activated, and for raising the voltage of the second power source line before the recall signal is deactivated, said second circuit receiving the array recall signal and a delayed array recall signal, and
  a third circuit for lowering the voltage of the first power source line after the recall signal is activated, and for raising the voltage of the first power source line after the voltage of the second power source line is raised and before the recall signal is deactivated, said third circuit receiving the delayed array recall signal.

6. A semiconductor nonvolatile memory device comprising:
  a first power source line;
  a second power source line;
  a static type random-access memory cell constituted by a flip-flop circuit having first and second input/output nodes, a first load connected between the first power source line and the first input/output node, and a second load connected between the second power source line and the second input/output node;
  an electrically erasable programmable read-only memory cell constituted by a nonvolatile memory transistor and a recall transistor coupled in series between the second input/output node and a terminal, a first external power source voltage being applied to the second input/output node through the terminal during a recall period when the nonvolatile memory transistor and recall transistor are turned ON; and
  a voltage/recall signal generating circuit, connected to the first and second power source lines and the recall transistor, said voltage/recall signal generating circuit receiving an array signal and a second external power source voltage, the voltage/recall signal generating circuit generating a recall signal in response to the array recall signal, said array recall signal defining the recall period to turn the recall transistor ON, and said voltage/recall signal generating circuit controlling a supply timing of the first and second power source lines during the recall period by pulling a voltage of the first power source line up to a predetermined voltage before the voltage of the second power source line is pulled up to the predetermined voltage, therein setting the flip-flop circuit selectively to one of two states corresponding to a value stored in the non-volatile memory cell, wherein said voltage/recall signal generating circuit includes
- a first delay circuit for delaying the array recall signal,
- a second delay circuit for delaying an output of the first delay circuit,
- a logic gate for generating the recall signal having a pulse width wider than an active period of the array recall signal, said logic gate receiving an output of the second delay circuit and the array recall signal,
- a first output circuit for lowering the voltage of the first power source line after the recall signal is activated, and for raising the voltage of the first power source line before the recall signal is deactivated, said first output circuit receiving the output of the first delay circuit, and
- a second output circuit for lowering the voltage of the second power source line after the recall signal is activated, and for raising the voltage of the second power source line after the voltage of the first power source line is raised and before the recall signal is deactivated, said second output circuit receiving the output of the first delay circuit and the array recall signal.

* * * * *